(12) United States Patent
Denison

(10) Patent No.: US 6,911,696 B2
(45) Date of Patent: Jun. 28, 2005

(54) LDMOS TRANSISTOR

(75) Inventor: Marie Denison, München (DE)

(73) Assignee: Infineon Technologies AG, Munich (DE)

(*) Notice: Subject to any disclaimer, the term of this patent is extended or adjusted under 35 U.S.C. 154(b) by 24 days.

(21) Appl. No.: 10/723,907

(22) Filed: Nov. 26, 2003

(65) Prior Publication Data

US 2004/0108549 A1 Jun. 10, 2004

(30) Foreign Application Priority Data

Nov. 26, 2002 (DE) .......................... 102 55 116

(51) Int. Cl.[7] .................... H01L 29/76; H01L 29/94; H01L 31/062; H01L 31/113; H01L 31/119

(52) U.S. Cl. .................. 257/343; 257/335; 257/337; 257/339; 257/341; 257/342; 257/492; 257/493

(58) Field of Search ................. 257/335, 337, 257/339, 341–343, 492–493

(56) References Cited

U.S. PATENT DOCUMENTS

| | | | | |
|---|---|---|---|---|
| 5,156,989 A | * | 10/1992 | Williams et al. | 438/206 |
| 5,237,193 A | * | 8/1993 | Williams et al. | 257/336 |
| 5,374,843 A | * | 12/1994 | Williams et al. | 257/492 |
| 5,430,316 A | * | 7/1995 | Contiero et al. | 257/335 |
| 6,288,424 B1 | * | 9/2001 | Ludikhuize | 257/335 |
| 6,462,378 B1 | * | 10/2002 | Kim | 257/342 |
| 6,593,621 B2 | * | 7/2003 | Tsuchiko et al. | 257/335 |
| 2002/0060341 A1 | * | 5/2002 | Terashima | 257/335 |

OTHER PUBLICATIONS

B. Jayant Baliga: "Modern Power Devices", *Krieger Publishing Company*, Malabar, Florida, 1987, pp. 81, 83 and 88.
Taylor Efland: "Lateral DMOS Structure Development for Advanced Power Technologies", *TI Technical Journal*, Mar./Apr. 1994, pp. 10–24.
S. Merchant et al.: "High–Performance 13–65 V Rated LDMOS Transistors in an Advanced Smart Power Technology", *IEEE*, 1999, pp. 225–227.

* cited by examiner

*Primary Examiner*—Amir Zarabian
*Assistant Examiner*—Ida M. Soward
(74) *Attorney, Agent, or Firm*—Laurence A. Greenberg; Werner H. Stemer; Ralph E. Locher

(57) ABSTRACT

A lateral double-diffused MOS transistor (LDMOS) has a body zone and additional body regions assigned to the body zone, thereby producing a "deep body." The deep body results in a quasi one-dimensional course of the potential lines, with the result that the dielectric strength is increased. The self-alignment between gate and channel is preserved, and parameter fluctuations are reduced.

14 Claims, 4 Drawing Sheets

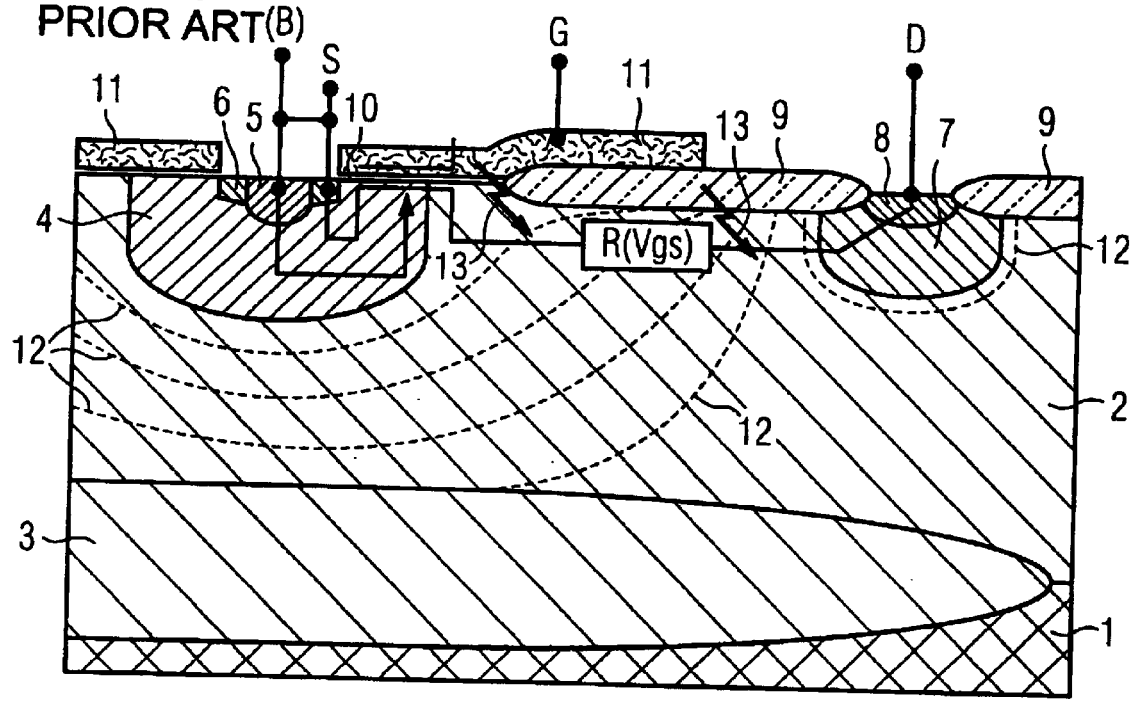
FIG 5 PRIOR ART(B)
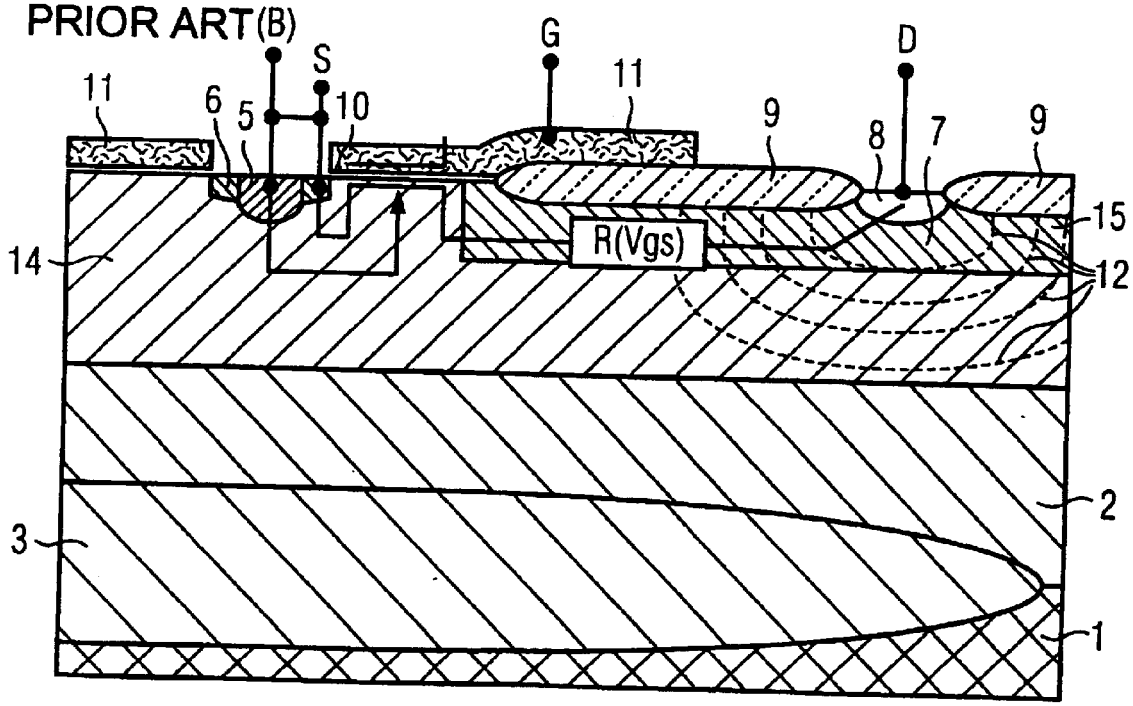
FIG 6 PRIOR ART(B)

LDMOS TRANSISTOR

BACKGROUND OF THE INVENTION

Field of the Invention

The present invention relates to a lateral double-diffused MOS field-effect transistor, also called LDMOS transistor for short. The device has a body zone provided in a semiconductor layer of a first conduction type. The body zone is of the second conduction type, opposite to the first conduction type. The device further has a highly doped source zone of the first conduction type located in the body zone, a highly doped drain terminal zone of the first conduction type provided in the semiconductor layer at a distance from the body zone, and a gate, with respect to which the body zone is self-aligned.

FIG. 5 shows a sectional illustration of a conventional LDMOS transistor with an n-channel (cf. T. Efland: *Lateral DMOS Structure Development for Advanced Power Technologies* in TI Technical Journal, March-April 1994, pp. 10–24). The conduction types specified are reversed in the case of a p-channel transistor. The transistor itself may be provided in an epitaxial layer applied on a semiconductor substrate. In this case, a highly doped buried layer may be located between the semiconductor substrate and the epitaxial layer. The buried layer, which may also be omitted if appropriate, may have the same conduction type as or opposite conduction type to the conduction type of the epitaxial layer. The semiconductor substrate preferably has the opposite conduction type to the conduction type of the epitaxial layer. An n-channel transistor will be taken as a basis below in order to simplify the illustration, although it goes without saying that the opposite conduction type and further variants are also possible. Silicon will be assumed to be the semiconductor material for the transistor. Instead of silicon, however, it is also possible to provide a different semiconductor material, such as, for example, silicon carbide, compound semiconductors, etc.

In the case of the conventional prior art LDMOS transistor of FIG. 5, an n-conducting epitaxial silicon layer 2 is provided on a p-conducting silicon substrate 1. An $n^+$-conducting buried layer 3 is formed between the silicon substrate 1 and the epitaxial layer 2. The buried layer 3 may be formed by implantation and diffusion into the substrate 1 before deposition of the epitaxial layer 2 and outdiffusion after the deposition of the layer 2.

Situated in the epitaxial layer 2 are a p-conducting body zone 4 with a $p^+$-conducting body terminal region 5 and an $n^+$-conducting source zone 6, adjoined by a channel in the body zone 4 below polycrystalline silicon of gate 11. Moreover, an n-conducting buffer zone 7—doped more heavily than the epitaxial layer 2—with an $n^+$-conducting drain terminal region 8 is provided at a distance from the body zone 4. The zone 7 and/or the terminal region 8 may also be omitted if appropriate. The gate 11 made of polycrystalline silicon or else some other suitable conductive material is situated on a thick insulating layer 9 made of field oxide, made of silicon dioxide for example, and on a thin insulating layer 10 made of gate oxide, such as, for example, likewise silicon dioxide.

The body terminal region 5 is provided with a body electrode B, while the source zone 6 is connected to a source electrode S. The body electrode and the source electrode are preferably interconnected to form an electrode S. The gate 11 is provided with a gate electrode G, while the drain terminal region 8 is connected to a drain electrode D.

The current path between the source electrode S and the drain electrode D is illustrated by a resistance or resistor R. The resistance of the resistor R depends on the voltage Vgs (Vgs=gate-source voltage) present at the gate 11. The channel region in the body zone 4 is diagrammatically represented by the corresponding part of the symbol of a MOS field-effect transistor.

In the case of the LDMOS of FIG. 5, the body zone 4 and the source zone 6 are implanted in a self-aligned manner via a hole in the polycrystalline silicon layer forming the gate 11, so that the length of the channel between the source zone 6 and the epitaxial layer 2 in the body zone 4 results from the differential outdiffusion of the source zone 6 and the body zone 4 after the implantation thereof. The drain comprises the region in the epitaxial layer 2 below the thick insulating layer 9, the buffer zone 7 and the drain terminal region 8. In this case, the buffer zone 7 and the drain terminal region 8 may be provided by different implantations of an n-conducting dopant, such as phosphorous or arsenic, for example. Boron is suitable as p-conducting dopant.

The concept of the LDMOS transistor illustrated in FIG. 5 has the essential advantage of a very short channel length in the region of the body zone 4 below the gate electrode G between the source zone 6 and the region of the drain that is formed by the epitaxial layer 2. Moreover, in this case the source zone 6 and also body zone 4 are self-aligned with respect to the gate 11, which has already been pointed out above. This self-alignment is associated with considerable advantages with regard to reduced parameter variations for, in particular, threshold voltage, on resistance, etc.

What is disadvantageous about the LDMOS transistor of FIG. 5, however, is its limited dielectric strength: the latter can be attributed to an unfavorable course of potential lines 12, which, at high voltages present at the drain electrode D, exhibit considerable bends especially in the region below the insulating layer 9, with the result that regions 13 wherein electrical breakdowns can readily occur are present there. Given economically acceptable on resistances of the LDMOS transistor, the dielectric strength thereof is thus limited to about 60 V (in this respect, cf. B. I. Baliga, *Modern Power Devices*, 1987, Krieger Publishing Company, pp. 81, 83 and 88, and S. Merchant et al., *High Performance 13–65V rated LDMOS transistors in an advanced Smart Power Technology*, ISPSD 1999).

In order to extend this limited dielectric strength, an alternative concept has already been conceived, namely the so-called RESURF (REduced SURface Field) LDMOS transistor, wherein the body zone—referred to here also as p-type well given the conduction type assumed above—extends over the entire area of the component. In this respect, reference is made to FIG. 6, which shows such a RESURF-LDMOS transistor with a p-conducting well 14 and an n-conducting RESURF zone 15. The RESURF zone 15 requires an additional implantation and forms a connection between source and drain. At high voltages present at the source electrode S and the drain electrode D, the RESURF zone 15 is completely depleted of charge carriers, which leads to a favorable course of the potential lines 12. The RESURF-LDMOS transistor of FIG. 6 is thus better suited to higher voltages than the LDMOS transistor of FIG. 5.

However, a considerable disadvantage of the RESURF concept of FIG. 6 resides in the fact that the channel length between the source zone 6 and the RESURF zone 15 below the polycrystalline silicon of the gate 11 in the well 14 is no longer self-aligned with the structure of the polycrystalline silicon, with the result that, with regard to small fluctuations which can readily occur due to the dictates of production, it has to be chosen to be longer than in the case of the LDMOS transistor of FIG. 5 (in this respect, also cf. T. Efland, supra). Problems on account of mask misalignments especially occur here.

It would be desirable, therefore, to combine the concept of an optimized on resistance on account of a self-aligned channel (cf. FIG. 5), with the concept of a high dielectric strength by virtue of an optimum course of the potential lines on account of the RESURF effect (cf. FIG. 6).

In order to achieve this aim, thought has already been given to using SOI (silicon on insulator) technology, which, on account of a depletion from the buried oxide, permits a self-aligned channel to be made compatible with a high dielectric strength. Moreover, it has already been proposed to provide, in bulk silicon, a RESURF transistor in the LDMOS concept with a gradated epitaxial layer in a well (cf. Merchant, supra).

FIG. 7 shows such a RESURF transistor: in this case, an n-conducting layer-like RESURF zone 15 is embedded in a p-conducting well 14'. In this case, the RESURF zone 15 is implanted areally over the active region of the LDMOS transistor before the field oxidation for the formation of the insulating layer 9. The p-conducting well 14', which together with the RESURF zone 15 enables the RESURF effect, also covers the active region of the LDMOS transistor except for a small window below the drain, in order to enable a connection to the bottom layer. This leads to a "double" RESURF effect wherein the well 14' is also depleted from below when a high drain voltage is present. In the case of this RESURF transistor, although the channel is self-aligned with respect to polysilicon, the p-conducting well 14' is misaligned with respect to the drain (cf. misalignment δ in FIG. 7).

The two concepts, that is to say SOI technology and bulk silicon, are unconvincing, however, since they on the one hand require a relatively large outlay (SOI) and on the other hand adhere to the RESURF principle with the associated disadvantages (bulk).

One advantage resides in the fact that a deep body region does not reach the silicon surface, so that misalignments with respect to the drain result in lower parameter fluctuations than in the case of an arrangement wherein a p-conducting well has its maximum doping at the surface of the semiconductor layer. In the case of the RESURF effect with overlapping p- and n-conducting wells, the differential doping is very critical since a slight fluctuation in the doping of one of the wells greatly influences the depletion. With a deep body region, there is no such overlap in the drift path.

SUMMARY OF THE INVENTION

It is accordingly an object of the invention to provide an LDMOS transistor, which overcomes the above-mentioned disadvantages of the heretofore-known devices and methods of this general type and which provides for an LDMOS transistor which, while being able to be fabricated in a simple manner, is distinguished by a self-alignment of its channel and a high dielectric strength on account of a favorable course of its potential lines and also by small parameter fluctuations during its fabrication; moreover, the intention is to specify an expedient method for fabricating such an LDMOS transistor.

With the foregoing and other objects in view there is provided, in accordance with the invention, an LDMOS transistor, comprising:

a semiconductor layer of a first conduction type;

a body zone of a second conduction type, opposite the first conduction type, formed in the semiconductor layer, the body zone having a lateral edge;

a highly doped source zone of the first conduction type formed in the body zone;

a highly doped drain terminal zone of the first conduction type formed in the semiconductor layer at a distance from the body zone;

a gate, the body zone being self-aligned with respect to the gate;

at least one additional body region disposed below the body zone in the semiconductor layer and projecting beyond the lateral edge of the body zone at least in a direction towards the drain terminal zone.

In the case of an LDMOS transistor of the type mentioned in the introduction, the objects of the invention are achieved by virtue of the fact that the body zone is provided with at least one additional body region of the other conduction type, which is situated below the body zone in the semiconductor layer and projects beyond the lateral edge of the body zone in the direction of the drain terminal zone. A "deep body" is thus formed by body zone and additional body region.

Preferably, instead of one additional body region, a plurality of additional body regions are provided, which extend further toward the drain terminal zone with increasing depth in the semiconductor layer. However, it is also possible for only one additional body region to be situated in large-area fashion under a RESURF zone of the first conduction type.

What is primarily important to the LDMOS transistor according to the invention, then, is that at least one additional body region which extends in the direction of the drain is formed below the body zone, as a result of which, on account of the depletion of charge carriers from the pn junction between the semiconductor layer and the deep body, the potential lines assume a quasi one-dimensional course when a high drain voltage is present, which is essential for optimization of the dielectric strength.

The advantages of self-alignment between gate and channel are preserved in the case of the LDMOS transistor according to the invention. Moreover, only small parameter fluctuations occur.

An advantageous method for fabricating the LDMOS transistor according to the invention is specified in patent Claim 9: the at least one additional body region is realized by means of deep implantation before the deposition of the polycrystalline silicon for the formation of the gate. It is equally possible to introduce the at least one additional body region for realizing the deep body before the field oxidation for forming a thick insulating layer in the semiconductor layer.

It should be noted that the first conduction type is preferably the n conduction type. However, the p conduction type may equally be involved. Moreover, in addition to silicon, it is also possible to use silicon carbide, compound semiconductors, etc. as semiconductor material for the LDMOS transistor according to the invention, to which reference has already been made in the introduction.

Other features which are considered as characteristic for the invention are set forth in the appended claims.

Although the invention is illustrated and described herein as embodied in an LDMOS transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a sectional illustration taken through a prior art LDMOS transistor;

FIG. 6 is a sectional illustration taken through a prior art RESURF-LDMOS transistor.

DESCRIPTION OF THE PREFERRED EMBODIMENTS

Figure 1:
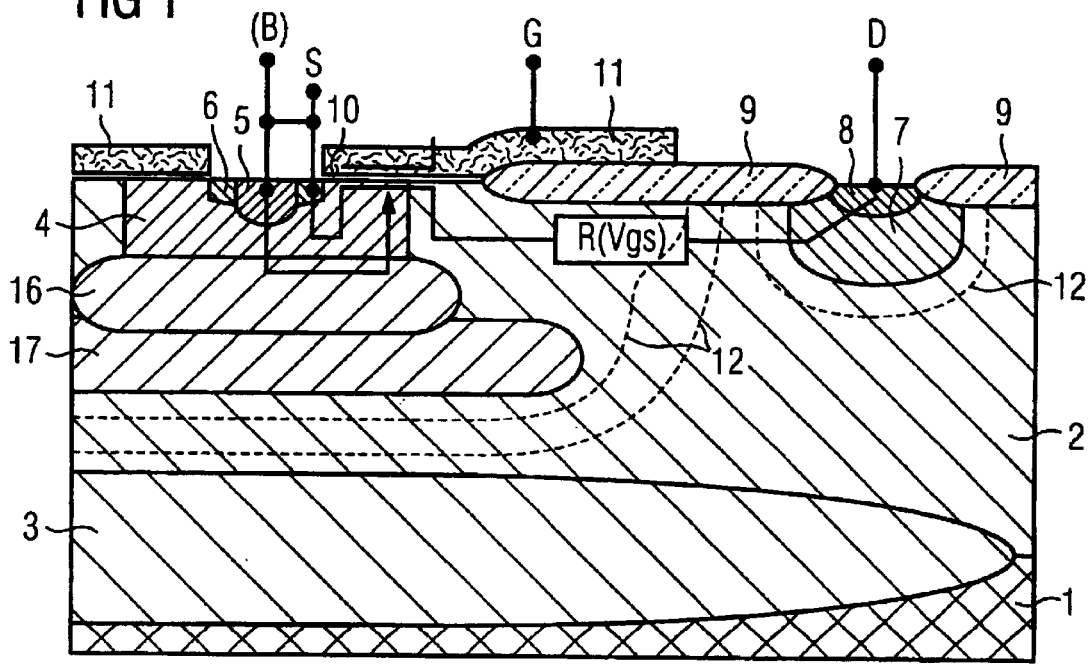
FIG. 1 is a sectional illustration taken through a first exemplary embodiment of the LDMOS transistor according to the invention.

Referring now to the figures of the drawing in detail and first, particularly, to FIG. 1 thereof, there is shown a first exemplary embodiment of the LDMOS transistor according to the invention, which combines the advantages of the existing LDMOS transistor of FIG. 5 and the existing RESURF-LDMOS transistor of FIG. 6 with one another in a particularly expedient manner: as in the case of the existing LDMOS transistor of FIG. 5, it is also the case in the exemplary embodiment of FIG. 1 that the channel in the body zone 4 is self-aligned with regard to the polycrystalline silicon of the gate 11. Moreover, the potential lines 12 have a favorable course when a high voltage is present at the drain electrode D. As a result, a large dielectric strength is present.

The objects of the invention are achieved by way of additional p-doped body regions 16, 17 below the body zone 4 in FIG. 1. These additional body regions 16, 17 extend laterally beyond the body zone 4 and may reach as far as a point under the thick insulating layer (field oxide 9). In this case, it is possible to provide for example only one additional body region, that is to say the region 16 for instance, in a manner adjoining the body zone 4. However, there may also be more than two additional body regions 16, 17.

All that is primarily important is that these additional body regions 16, 17, which form the above-mentioned "deep body" result in a quasi one-dimensional course of the potential lines 12 at high drain voltages, so that the potential lines 12 run practically parallel to one another with a large radius of curvature from the region between the deep body and the n⁺-conducting buried layer 3 more or less vertically upward toward the thick insulating layer 9.

Figure 2:
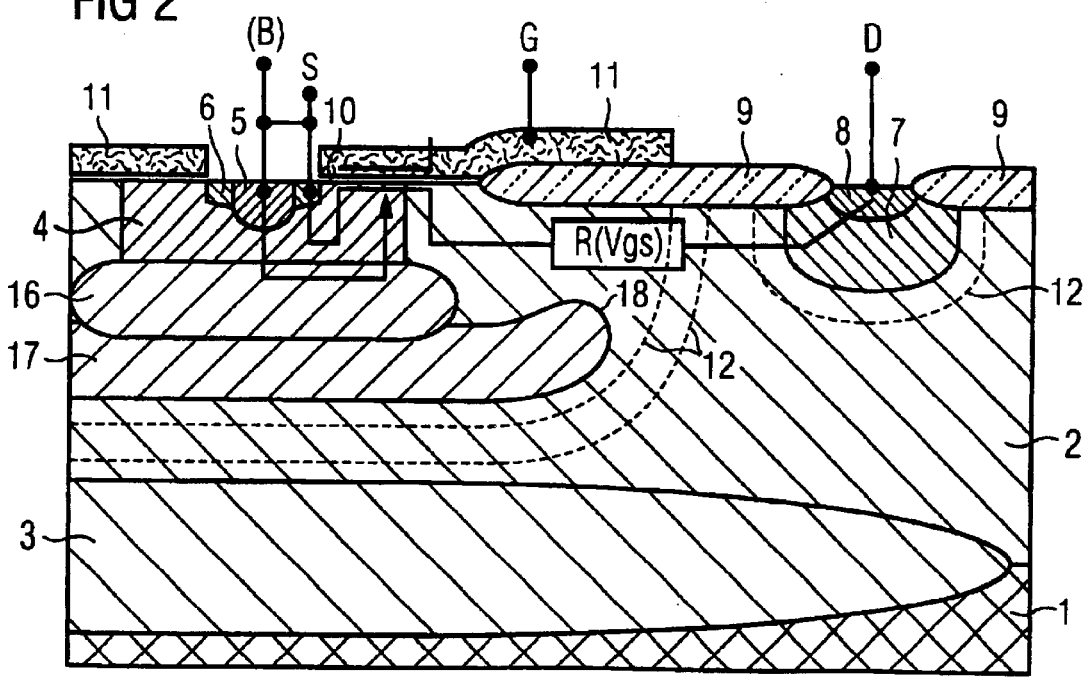
FIG. 2 is a sectional illustration taken through a modification of the LDMOS transistor of FIG. 1.

With reference to FIG. 2, a slight extension 18 of the additional body region 17 already leads to a further smoothing of the potential lines 12 and an increase in the dielectric strength by a number of volts can be achieved just by way of this extension 18. Measurements have shown that an increase in the dielectric strength which is of the order of magnitude of 10 V is obtained with as few as a single additional body region, for instance the body region 16.

The doping concentrations in the additional body regions 16, 17 may be of the same magnitude as the doping concentration of the body zone 4. However, higher or lower doping concentrations than in the body zone 4 are also possible, if appropriate, for the additional body regions 16, 17, depending on their extension and shape. All that is of crucial importance is that these additional body regions 16, 17 establish the desired quasi one-dimensional structure of the potential lines 12 especially in the region below the thick insulating layer 9, that is to say below the field oxide. In the deep body, the doping is in any event to be set in such a way that the one-dimensional potential profile is achieved by virtue of the depletion of the junction between the epitaxial layer 2 and the body region.

Figure 3:
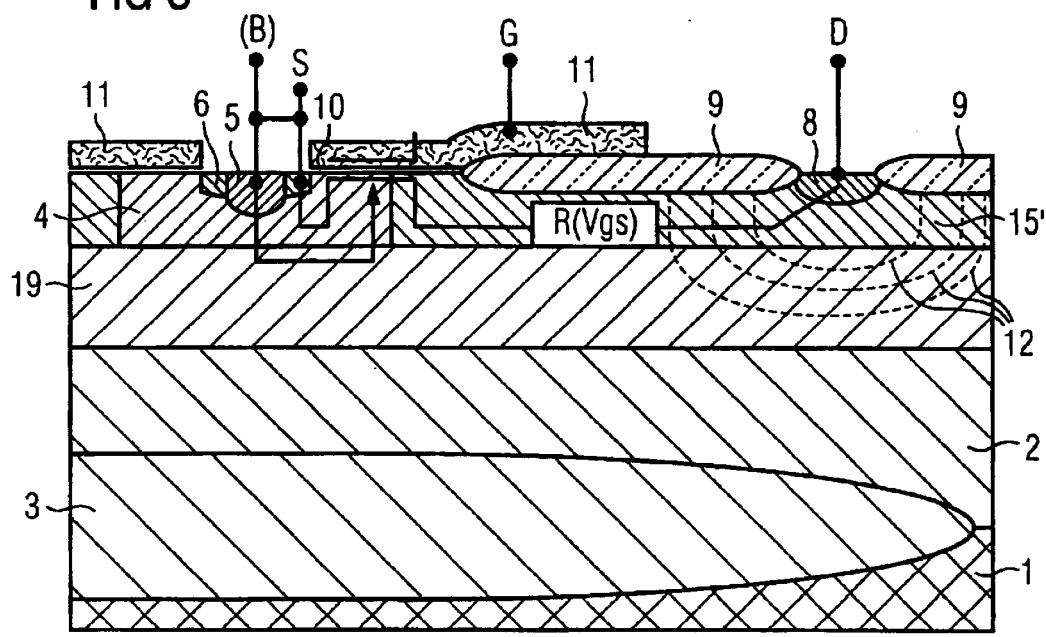
FIG. 3 is a sectional illustration taken through a further exemplary embodiment of the LDMOS transistor according to the invention.

FIG. 3 shows a further exemplary embodiment of the LDMOS transistor according to the invention with a large-area n-doped RESURF zone 15' and one likewise large-area additional body region 19. In this exemplary embodiment, too, the body zone 4 and the source zone 6 are self-aligned with regard to the polysilicon crystalline of the gate 11, and the potential lines 12 have a favorable course similar to that in the existing RESURF-LDMOS transistor of FIG. 6. In other words, this exemplary embodiment of the LDMOS transistor according to the invention is also distinguished by a high dielectric strength.

During the fabrication of the LDMOS transistor according to the invention, the additional body regions 16, 17 or 19, which form the "deep body", may be formed either before or after the insulating process, that is to say the production of the thick insulating layer 9 (field oxide). In the event of fabrication before the insulation process, a structure corresponding to the exemplary embodiment of FIG. 1 is obtained, while production after the insulation process leads to a structure corresponding to the exemplary embodiment of FIG. 2 since here the extension 18 is formed on account of the lower penetration depth of the implantation below the insulating layer 9. In the exemplary embodiment of FIG. 3, the doping of the n-conducting RESURF zone 15' is counterdoped during the formation of the body zone 4 by the high doping thereof.

Figure 4:
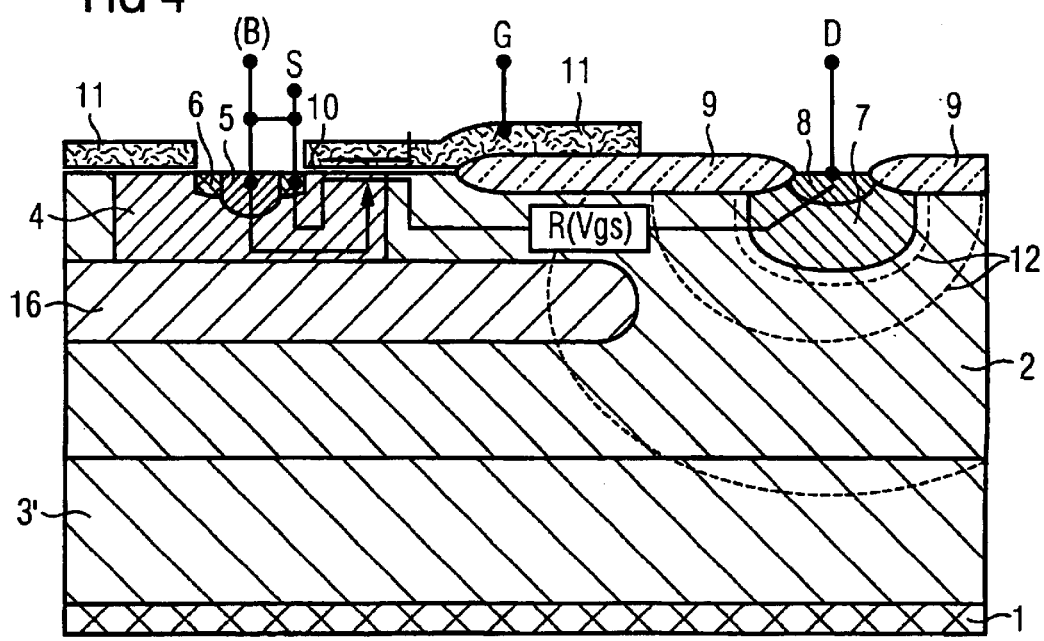
FIG. 4 is a sectional illustration taken through a further exemplary embodiment of the LDMOS transistor according to the invention.
Figure 7:
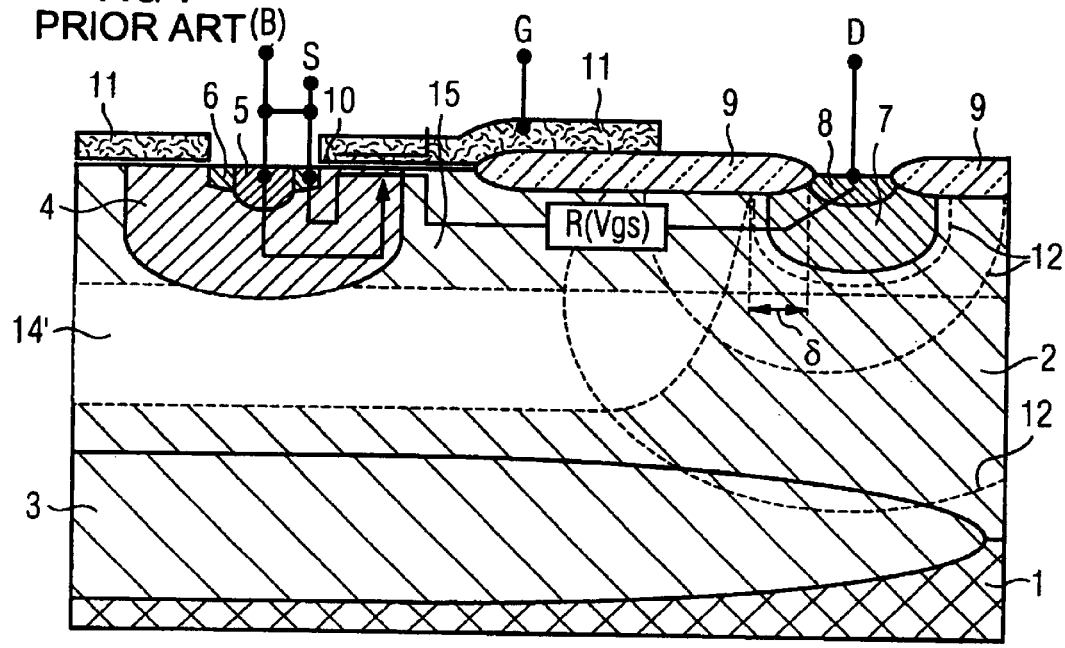
FIG. 7 is a sectional illustration taken through another conventional prior art LDMOS transistor.

FIG. 4 shows another exemplary embodiment of the LDMOS transistor according to the invention, having a p⁺-conducting buried layer 3' and only one additional p-conducting region 16, which adjoins the p-conducting body zone 4 and extends laterally in the n-conducting layer 2 as far as a point under the insulating layer 9. The desired one-dimensional course of the potential lines 12 is achieved in this case, too. It should also be noted that the buried layer 3 can be omitted, if appropriate.

I claim:

1. An LDMOS transistor, comprising:

a semiconductor layer of a first conduction type;

a body zone of a second conduction type, opposite the first conduction type, formed in said semiconductor layer, said body zone having a lateral edge;

a highly doped source zone of the first conduction type formed in said body zone;

a highly doped drain terminal zone of the first conduction type formed in said semiconductor layer at a distance from said body zone;

a gate, said body zone being self-aligned with respect to said gate;

at least one additional body region disposed below said body zone in said semiconductor layer and projecting beyond said lateral edge of said body zone at least in a direction towards said drain terminal zone.

2. The LDMOS transistor according to claim 1, wherein said at least one additional body region is one of a plurality of additional body regions extending farther toward said drain terminal zone with an increasing depth in said semiconductor layer.

3. The LDMOS transistor according to claim 1, wherein said additional body region is provided under a RESURF zone of the first conduction type.

4. The LDMOS transistor according to claim 1, wherein said semiconductor layer is disposed over a buried layer on a semiconductor substrate.

5. The LDMOS transistor according to claim 4, wherein said buried layer has the first conduction type.

6. The LDMOS transistor according to claim 4, wherein said buried layer has the second conduction type.

7. The LDMOS transistor according to claim 1, which comprises a thick insulating layer, and wherein said gate extends over said thick insulating layer.

8. The LDMOS transistor according to claim 1, wherein the first conduction type is an n conduction type.

9. The LDMOS transistor according to claim 1, which comprises a buffer zone of the first conduction type, and wherein said drain terminal zone is embedded in said buffer zone.

10. The LDMOS transistor according to claim 1, which further comprises a buried layer, and wherein said additional body regions are disposed at a distance from said buried layer.

11. In a method for fabricating the LDMOS transistor according to claim 1, which comprises: carrying out at least one implantation to form the at least one additional body region prior to depositing a polycrystalline silicon layer for forming a gate of the LDMOS transistor according to claim 1.

12. The method according to claim 11 for fabricating a transistor with the additional body region provided under a RESURF zone of the first conduction type, which comprises counterdoping a doping of the RESURF zone in the source region, for forming the body zone.

13. In a method for fabricating the LDMOS transistor according to claim 7, which comprises: carrying out at least one implantation to form the at least one additional body region prior to forming the thick insulating layer on a surface of the semiconductor layer of the LDMOS transistor according to claim 7.

14. The method according to claim 13 for fabricating a transistor with the additional body region provided under a RESURF zone of the first conduction type, which comprises counterdoping a doping of the RESURF zone in the source region, for forming the body zone.

* * * * *